United States Patent
Bergman et al.

(10) Patent No.: US 10,015,880 B1
(45) Date of Patent: Jul. 3, 2018

(54) RIP STOP ON FLEX AND RIGID FLEX CIRCUITS

(71) Applicant: Multek Technologies Ltd., San Jose, CA (US)

(72) Inventors: Mark Bergman, Redwood City, CA (US); Joan K. Vrtis, Mesa, AZ (US)

(73) Assignee: Multek Technologies Ltd., San Jose, CA (US)

( * ) Notice: Subject to any disclaimer, the term of this patent is extended or adjusted under 35 U.S.C. 154(b) by 0 days.

(21) Appl. No.: 14/565,227

(22) Filed: Dec. 9, 2014

Related U.S. Application Data

(60) Provisional application No. 61/913,830, filed on Dec. 9, 2013, provisional application No. 61/916,722, filed on Dec. 16, 2013.

(51) Int. Cl.
   H05K 1/02 (2006.01)
   H05K 3/22 (2006.01)

(52) U.S. Cl.
   CPC ......... *H05K 1/0271* (2013.01); *H05K 3/22* (2013.01); *H05K 2201/05* (2013.01)

(58) Field of Classification Search
   CPC ..... H05K 3/22; H05K 1/0271; H05K 2201/05
   See application file for complete search history.

(56) References Cited

U.S. PATENT DOCUMENTS

| | | |
|---|---|---|
| 3,471,348 A | 10/1969 | Iles |
| 4,733,383 A | 3/1988 | Waterbury |
| 4,931,021 A | 6/1990 | Mohan |
| 4,956,524 A | 9/1990 | Karkow |
| 5,085,922 A * | 2/1992 | Murasawa ........... H05K 1/0271 257/702 |
| 5,184,827 A | 2/1993 | Suttle |
| 5,259,833 A | 11/1993 | Barnett |
| 5,326,652 A | 7/1994 | Lake |
| 5,555,915 A | 9/1996 | Kanao |
| 5,778,941 A | 7/1998 | Inada |
| 5,816,848 A | 10/1998 | Zimmerman |
| 6,103,971 A | 8/2000 | Sato et al. |
| 6,160,254 A | 12/2000 | Zimmerman |
| 6,172,344 B1 | 1/2001 | Gordon et al. |
| 6,192,940 B1 | 2/2001 | Koma et al. |
| 6,307,751 B1 | 10/2001 | Bodony |
| 6,339,193 B1 | 1/2002 | Goett et al. |
| 6,349,201 B1 | 2/2002 | Ford |
| 6,591,463 B2 | 7/2003 | Wang |
| 6,711,024 B1 | 3/2004 | Johansson |
| 6,743,982 B2 | 6/2004 | Biegelsen |
| 6,747,227 B2 | 6/2004 | Marmaropoulos et al. |
| 6,805,568 B2 | 10/2004 | Kuzmenka |

(Continued)

*Primary Examiner* — William H Mayo, III
*Assistant Examiner* — Hiram E Gonzalez
(74) *Attorney, Agent, or Firm* — Haverstock & Owens LLP

(57) ABSTRACT

A rip stop material is attached at a stress area of a flexible circuit board in order to strengthen the flexible circuit board and minimize ripping and cracking in the polyimide and/or the copper conductors of the circuit. A rip stop transition layer is formed and deposited at a location on the flexible circuit in order to minimize, reduce, if not preventing cracking and ripping of the circuit as it is bent and flexed. The rip stop transition layer can be placed at different locations on and within the flexible circuit in order to minimize cracking and ripping as the flexible circuit is bent, flexed and twisted.

20 Claims, 3 Drawing Sheets

(56) References Cited

U.S. PATENT DOCUMENTS

| | | |
|---|---|---|
| 7,019,973 B2 | 3/2006 | Rivera |
| 7,041,357 B2 * | 5/2006 | Hsieh .................... B29C 70/083 |
| | | 174/110 SR |
| 7,156,127 B2 | 1/2007 | Moulton et al. |
| 7,191,803 B2 | 3/2007 | Orr |
| 7,234,831 B1 | 6/2007 | Hanley |
| 7,319,895 B2 | 1/2008 | Klefstad-Sillonville |
| 7,491,892 B2 | 2/2009 | Biegelson et al. |
| 7,494,238 B2 | 2/2009 | Genz |
| 7,573,727 B2 | 8/2009 | Hauenstein |
| 7,629,691 B2 | 12/2009 | Roush |
| 7,641,488 B2 | 1/2010 | Ho |
| 7,643,305 B2 * | 1/2010 | Lin ..................... H05K 1/0281 |
| | | 361/749 |
| 7,735,523 B2 | 6/2010 | Smith et al. |
| 7,786,389 B2 * | 8/2010 | Tsukada ................ H05K 1/028 |
| | | 174/254 |
| 7,795,540 B2 | 9/2010 | Yamada et al. |
| 8,157,730 B2 | 4/2012 | LeBoeuf |
| 8,207,473 B2 | 6/2012 | Axisa |
| 8,258,011 B2 | 9/2012 | Brun |
| 8,269,112 B2 | 9/2012 | Lee |
| 8,283,602 B2 | 10/2012 | Augustine et al. |
| 8,467,726 B2 | 6/2013 | Shirakata |
| 8,469,741 B2 | 6/2013 | Oster |
| 8,861,220 B2 | 10/2014 | Loher |
| 8,883,287 B2 | 11/2014 | Boyce |
| 9,018,532 B2 | 4/2015 | Wesselmann et al. |
| 9,247,648 B2 | 1/2016 | Vanfleteren |
| 9,340,003 B2 | 5/2016 | Chang |
| 9,418,927 B2 | 8/2016 | Axisa |
| 9,538,641 B2 | 1/2017 | Markus |
| 9,699,893 B2 | 7/2017 | Matsumoto |
| 9,706,647 B2 | 7/2017 | Hsu |
| 9,730,330 B1 | 8/2017 | Boyle |
| 2002/0076948 A1 | 6/2002 | Farrell |
| 2002/0094701 A1 | 7/2002 | Biegelsen |
| 2003/0093248 A1 | 5/2003 | Vock |
| 2003/0098084 A1 | 5/2003 | Ragner et al. |
| 2003/0111126 A1 | 6/2003 | Moulton et al. |
| 2003/0127246 A1 | 7/2003 | Watanabe |
| 2003/0129905 A1 | 7/2003 | Dhawan et al. |
| 2004/0082189 A1 | 4/2004 | Totokawa |
| 2004/0111045 A1 | 6/2004 | Sullivan |
| 2004/0192082 A1 | 9/2004 | Wagner |
| 2004/0229533 A1 | 11/2004 | Braekevelt |
| 2004/0243204 A1 | 12/2004 | Maghribi |
| 2004/0259391 A1 | 12/2004 | Jung |
| 2005/0022338 A1 | 2/2005 | Muhlenkamp |
| 2005/0154264 A1 | 7/2005 | Lecompte |
| 2005/0224993 A1 | 10/2005 | Manepalli et al. |
| 2005/0280157 A1 | 12/2005 | Roush |
| 2006/0000633 A1 | 1/2006 | Hopper |
| 2006/0035554 A1 | 2/2006 | Glaser et al. |
| 2006/0046471 A1 | 3/2006 | Kirby |
| 2006/0128346 A1 | 6/2006 | Yasui |
| 2006/0254811 A1 | 11/2006 | Kirstein |
| 2006/0282018 A1 | 12/2006 | Balzano |
| 2007/0001844 A1 | 1/2007 | Krill |
| 2007/0054511 A1 | 3/2007 | Ittel |
| 2007/0125295 A1 | 6/2007 | Sanguinetti |
| 2007/0190881 A1 | 8/2007 | Shibaoka et al. |
| 2007/0232455 A1 | 10/2007 | Hanoun |
| 2007/0290305 A1 | 12/2007 | Oyama |
| 2008/0060873 A1 | 3/2008 | Lang |
| 2008/0157235 A1 | 7/2008 | Rogers |
| 2008/0182475 A1 | 7/2008 | Gnade |
| 2008/0223844 A1 | 9/2008 | Cronn |
| 2008/0224941 A1 * | 9/2008 | Sugiyama ............ H01L 23/145 |
| | | 343/873 |
| 2008/0241663 A1 | 10/2008 | Yamashita |
| 2008/0258314 A1 | 10/2008 | Yoo |
| 2008/0271220 A1 | 11/2008 | Chilton |
| 2009/0173529 A1 | 7/2009 | Lee |
| 2009/0309739 A1 | 12/2009 | Ezer |
| 2009/0315320 A1 | 12/2009 | Finn |
| 2009/0317639 A1 | 12/2009 | Axisa |
| 2010/0090834 A1 | 4/2010 | Buchnick |
| 2010/0116526 A1 | 5/2010 | Arora |
| 2010/0325770 A1 | 10/2010 | Chung |
| 2011/0063098 A1 | 3/2011 | Fischer |
| 2011/0245633 A1 | 3/2011 | Goldberg |
| 2011/0119812 A1 | 5/2011 | Genz |
| 2011/0130060 A1 | 6/2011 | Chung et al. |
| 2011/0163569 A1 | 7/2011 | Yoneyama |
| 2011/0175630 A1 | 7/2011 | Bhattacharya |
| 2011/0262785 A1 | 10/2011 | Johnson |
| 2012/0050036 A1 | 3/2012 | Landry |
| 2012/0176764 A1 | 7/2012 | Loher |
| 2012/0314382 A1 | 12/2012 | Wesselmann |
| 2013/0160183 A1 | 6/2013 | Reho |
| 2013/0161055 A1 | 6/2013 | Rule |
| 2013/0183646 A1 | 7/2013 | Lusted |
| 2013/0216065 A1 | 8/2013 | Nguyen |
| 2013/0220535 A1 | 8/2013 | Lee |
| 2013/0247288 A1 | 9/2013 | Kotos |
| 2013/0256004 A1 | 10/2013 | Cotton |
| 2013/0316551 A1 | 11/2013 | Day, Jr. |
| 2014/0124257 A1 | 5/2014 | Yoshihara |
| 2014/0190729 A1 * | 7/2014 | Briggs ................ H05K 1/0225 |
| | | 174/254 |
| 2014/0220422 A1 | 8/2014 | Rogers |
| 2014/0275857 A1 | 9/2014 | Toth |
| 2014/0299362 A1 | 10/2014 | Park |
| 2014/0362020 A1 | 12/2014 | Rothkopf |
| 2015/0009129 A1 | 1/2015 | Song |
| 2015/0015288 A1 | 1/2015 | Ma |
| 2015/0041201 A1 | 2/2015 | Van Heck |
| 2015/0068069 A1 | 3/2015 | Tran |
| 2015/0091711 A1 | 4/2015 | Kosonen |
| 2015/0109124 A1 | 4/2015 | He |
| 2015/0122532 A1 * | 5/2015 | Nelson ................ H05K 3/4688 |
| | | 174/254 |
| 2015/0185944 A1 | 7/2015 | Magi |
| 2015/0245777 A1 | 9/2015 | Della |
| 2015/0312653 A1 | 10/2015 | Avrahami |
| 2016/0007468 A1 | 1/2016 | Tomikawa |
| 2016/0034634 A9 | 2/2016 | Hong |
| 2016/0132150 A1 | 3/2016 | Cotton |
| 2016/0187122 A1 | 6/2016 | Krimon |
| 2016/0190880 A1 | 10/2016 | Lewis |

\* cited by examiner

RIP STOP ON FLEX AND RIGID FLEX CIRCUITS

RELATED APPLICATIONS

This Patent Application claims priority under 35 U.S.C. 119(e) of the co-pending U.S. provisional patent application Ser. No. 61/916,722, filed on Dec. 17, 2013, and entitled "NANO-COPPER VIA FILL FOR THERMAL PLATED THROUGH HOLE APPLICATIONS," which is also hereby incorporated by reference in its entirety.

FIELD OF THE INVENTION

The present invention is generally directed to wearable electronics and wearable electronic medical devices. More specifically, the present invention is directed to a means for limiting stress in and strengthening deformable electronics.

BACKGROUND OF THE INVENTION

Electronic devices are increasingly being developed so as to be worn by a user, such as in wearable electronics. As these wearable electronics gain traction in the marketplace, a new breed of devices that are able to bend, flex and stretch must be developed. These mechanical requirements present reliability challenges on mechanical components, circuit boards and interconnects, as well as electronic components. In order to limit the stress and strain to these components while still maintaining flexibility, mechanical provisions must be put in place.

SUMMARY OF THE INVENTION

A rip stop material is attached at a stress area of a flexible circuit board in order to strengthen the flexible circuit board and minimize ripping and cracking of the circuit board and in the polyimide and/or the copper conductors of the circuit. A rip stop transition layer is formed and deposited at a location on the flexible circuit in order to minimize, reduce, if not preventing cracking and ripping of the circuit as it is bent and flexed. The rip stop transition layer can be placed at different locations on and within the flexible circuit in order to minimize cracking and ripping as the flexible circuit is bent, flexed and twisted.

In one aspect, a deformable electronic comprises a deformable electronic body comprising a flexible base with one or more coverlays coupled to the flexible base and a rip stop material deposited at a location on the body in order to minimize, reduce, if not preventing cracking and ripping of the body as the body is flexed. In some embodiments, the rip stop material is deposited at a high stress location of the deformable electronic. Particularly, the rip stop material comprises an open weave interlocking fabric. In some embodiments, the rip stop material is attached to one of a rigid, a rigid-flex, a stretch, a rigid-stretch, and a mechanism housing of the deformable electronic. In some embodiments, the deformable electronic comprises a flexible circuit board. In further embodiments, the rip stop material is attached to one of the inside and the outside of the deformable electronic. In some embodiments, the deformable electronic comprises a plurality of rip stop material layers. In further embodiments, the rip stop material is laminated on a top of the one or more coverlays as a cap of the deformable electronic is laminated. In some embodiments, the rip stop material is laminated on top of the flexible base before the one or more coverlays are laminated. In some embodiments, the rip stop material is deposited at a high twist area of the deformable electronic.

In another aspect, a method of strengthening a deformable electronic comprises forming a rip stop transition layer and depositing the rip stop transition layer at a location on a body of the deformable electronic in order to minimize, reduce, if not preventing cracking and ripping of the body as it is flexed. In some embodiments, the rip stop material is deposited at a high stress location of the deformable electronic. Particularly, the rip stop material comprises an open weave interlocking fabric. In some embodiments, the rip stop material is attached to one of a rigid, a rigid-flex, a stretch, a rigid-stretch, and a mechanism housing of the deformable electronic. In some embodiments, the deformable electronic comprises a flexible circuit board. In further embodiments, the rip stop material is attached to one of the inside and the outsides of the deformable electronic. In some embodiments, the deformable electronic comprises a plurality of rip stop material layers. In further embodiments, the rip stop material is laminated on a top of the one or more coverlays as a cap of the deformable electronic is laminated. In some embodiments, the rip stop material is laminated on top of the flexible base before the one or more coverlays are laminated. In some embodiments, the rip stop material is deposited at a high twist area of the deformable electronic.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the invention are directed to applying a rip stop material to a flexible circuit board in order to strengthen the circuit and minimize, reduce, if not preventing rips and cracks. A rip stop material is attached at a stress area of a flexible circuit board in order to strengthen the flexible circuit board and minimize ripping and cracking in the polyimide and/or the copper conductors of the circuit. A rip stop transition layer is formed and deposited at a location on the flexible circuit in order to minimize, reduce, if not preventing cracking and ripping of the circuit as it is bent and flexed. The rip stop transition layer can be placed at different locations on and within the flexible circuit in order to minimize cracking and ripping as the flexible circuit is bent, flexed and twisted. For example, in some embodiments, the rip stop material is dispersed throughout the circuit as a coverlay, an underlay, and symmetrically positioned within the circuit board as an overlay and an underlay.

Reference will now be made in detail to implementations of mechanical measures for strengthening a flexible circuit board as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
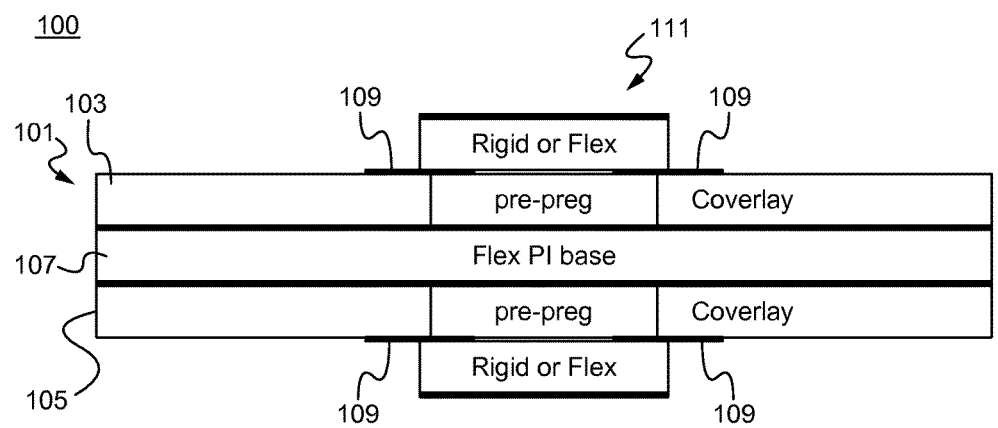
FIG. 1 illustrates a flexible circuit board in accordance with some embodiments.

Referring now to FIG. 1, a flexible circuit board or deformable electronic is depicted therein. The flexible circuit board 100 comprises a multi-layer body 101 comprising a top cover layer 103, a bottom cover layer 105, a flexible base 107, and a center pre-preg section 111. Although the flexible circuit board 100 is shown having a top coverlay 103 and a bottom coverlay 105, the flexible circuit 100 is able to comprise more or less coverlays as appropriately desired. The center pre-preg section 111 is able to comprise a rigid or flexible section. Particularly, the flexible circuit 100 is able to comprise one or more rigid, rigid-flexible, flexible, stretchable and rigid-stretchable sections. One or more rip stop layers 109 are deposited throughout the body 101 of the flexible circuit. The one or more rip stop layers 109 strengthen the flexible circuit 100 so it is not ripped or cracked as the circuit 100 is bent, flexed, and twisted. The one or more rip stop layers 109 are attached at a specific location in order to strengthen the flexible circuit 100. The one or more rip stop layers 109 are deposited on the inner layers and/or outer layers of the circuit 100 depending upon the desired application.

Interconnects can be formed between one or more rigid component sections and one or more flexible sections of the circuit body. In some embodiments, the interconnects are electrical interconnects, such as conductive traces. In other embodiments, the interconnects are optical interconnects, such as waveguides. It is understood that other types of interconnects are contemplated.

The rip stop material is an open weave fabric comprising a series of threads woven in an interlocking cross-hatching patten. During weaving, the threads are interwoven at regular intervals in the cross-hatch pattern. The cross-hatch pattern and reinforcing technique makes the rip stop material resistant to ripping and tearing while maintaining a high strength to weight ratio. Particularly, the one or more rip stop material layers 109 can be placed in high stress areas of the flexible or rigid stack up in order to minimize ripping and tearing of the flexible circuit 100 and its polyimide and/or copper conductors. In some embodiments, the one or more rip stop material layers 109 utilize a thermal set adhesive embedded within an open weave fabric and are attached to the flexible circuit 100. In some embodiments the one or more rip stop layers 109 are heat resistant. As shown in FIG. 1, the one or more rip stop layers 109 are laminated on a top of the coverlay 103 and the coverlay 105 as a cap is laminated. The cap is able to comprises a rigid or flexible cap.

Figure 2A:
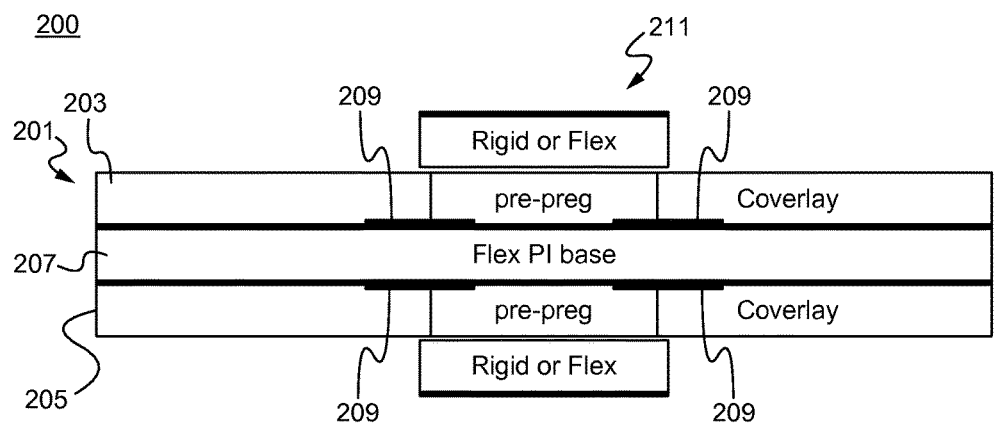
FIGS. 2A-2C illustrate a flexible circuit board in accordance with some embodiments.
Figure 2B:
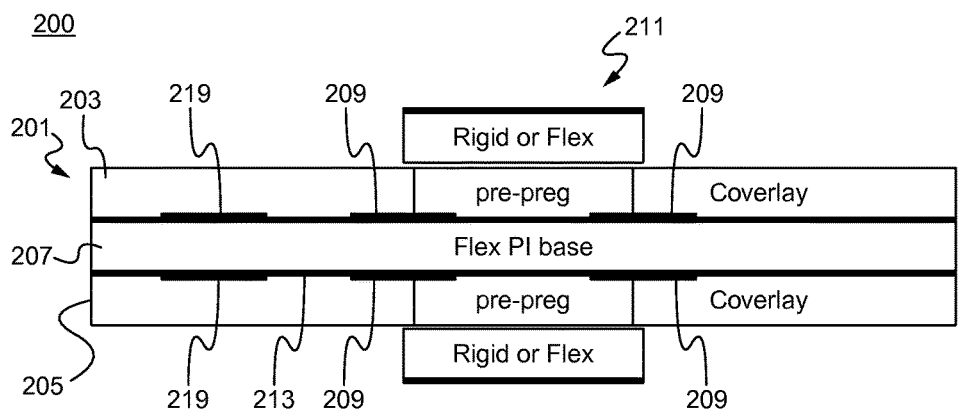
Figure 2C:
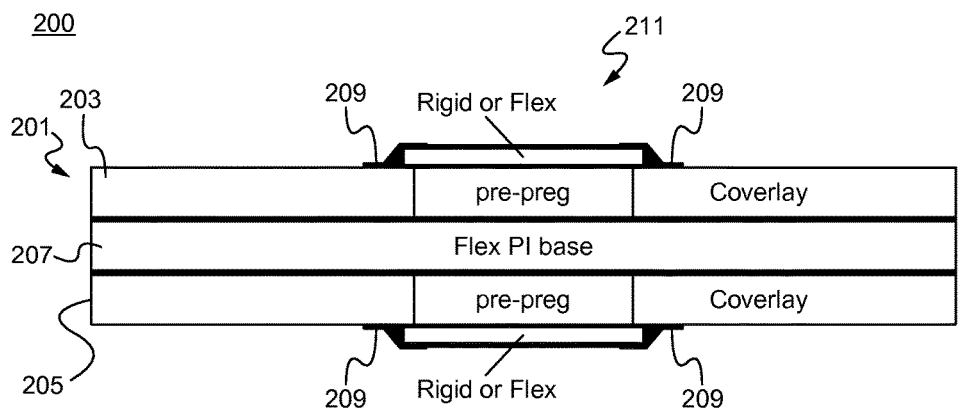

FIGS. 2A-2C illustrate a flexible circuit board or deformable electronic in accordance with some embodiments. The flexible circuit 200 is similar to the flexible circuit as described above in relation to FIG. 1. The flexible circuit board 200 comprises a multi-layer body 201 comprising a top cover layer 203, a bottom cover layer 205, a flexible base 207, and a center pre-preg section 211. Although the flexible circuit board 200 is shown having a top coverlay 203 and a bottom coverlay 205, the flexible circuit 200 is able to comprise more or less coverlays as appropriately desired. The center pre-preg section 211 is able to comprise a rigid or flexible section. One or more rip stop layers 209 are deposited throughout the body 201 of the flexible circuit 200. As described above, the one or more rip stop layers 209 strengthen the flexible circuit 200 so it is not ripped or cracked as the circuit 200 is bent, flexed, and twisted. The one or more rip stop layers 209 are attached at a specific location in order to strengthen the flexible circuit 200. The one or more rip stop layers 209 are deposited on the inner layers and/or outer layers of the circuit 200 depending upon the desired application. Particularly as shown within FIGS. 2A-2C, in the one or more rip stop layers 209 can be dispersed throughout the circuit as a coverlay, an underlay, and symmetrically positioned within the circuit board as an overlay and an underlay.

As shown within FIG. 2A, the one or more rip stop material layers 209 are attached to the flexible base 207. Particularly, the one or more rip stop layers 209 are attached to the flexible base 207 and on opposite sides of the center pre-preg section 211. The one or more rip stop layers 209 are attached at a specific location in order to strengthen the flexible circuit 200 so it is not ripped or cracked as the circuit 200 is bent, flexed, and twisted. The one more rip stop material layers 209 are laminated on top of the flexible base before the coverlays are laminated within the flexible circuit 200. In some embodiments, the one or more rip stop layers 209 utilize a thermal set adhesive and are heat resistant.

As shown within FIG. 2B, one or more rip stop material layers 219 are attached at a high stress area 213 of the flexible circuit 200. Particularly, the high stress area 213 comprises a high twist area of the circuit 200. The one or more rip stop material layers 219 enable the flexible circuit 200 to twist and bend without ripping or cracking. The one or more rip stop layers 209 and the one or more rip stop layers 219 are placed throughout the inside layers and/or the outside layers and at specific locations in order to strengthen and protect the flexible circuit 200. Particularly, the one or more rip stop layers 209 are able to be located at high stress areas such as where the circuit is commonly bent, twisted and flexed.

FIG. 2C shows one or more rip stop material layers 209 attached to the a center pre-preg section 211 and the coverlays. As described above, the center pre-preg section 211 is able to comprise a rigid or flexible section. The one or more rip stop material layers 209 are laminated on top of the center pre-preg section 21 and the coverlays of the flexible circuit 200. In some embodiments, the one or more rip stop layers 209 utilize a thermal set adhesive and are heat resistant.

Figure 3:
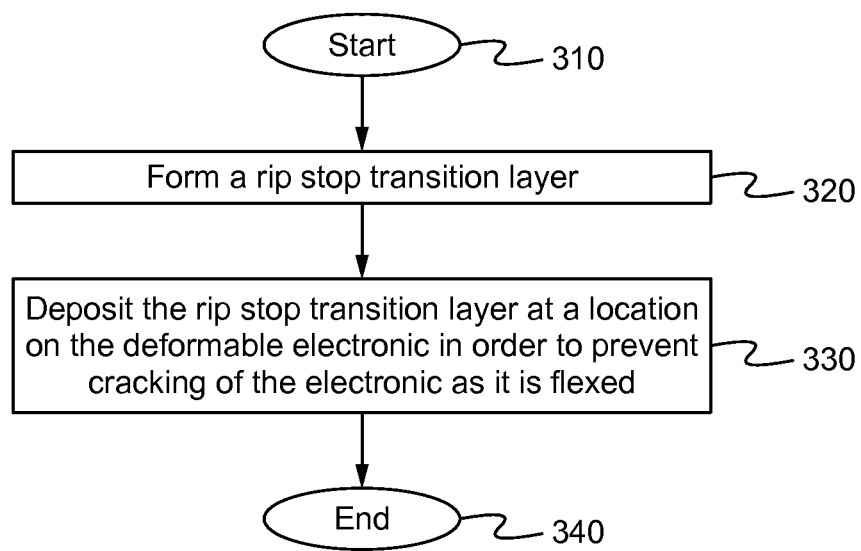
FIG. 3 illustrates a method of strengthening a flexible circuit board in accordance with some embodiments.

FIG. 3 illustrates a method of strengthening a deformable electronic such as a flexible circuit board. The method begins in the step 310. In the step 320, a rip stop transition layer is formed. In some embodiments, the rip stop material is an open weave fabric comprising a series of threads woven in an interlocking cross-hatching patten. Then, in the step 330, the rip stop transition layer is deposited at a location on the flexible circuit board in order to minimize, reduce, if not preventing cracking and ripping as the circuit board is flexed. In some embodiments, the rip stop transition layer utilizes a thermal set adhesive and are heat resistant. In some embodiments, the rip stop transition layer is placed in a high stress areas of the flexible or rigid stack up in order to minimize ripping and tearing of the flexible circuit and its polyimide and/or copper conductors. The rip stop transition layer is attached to one or more rigid, rigid-flexible, flexible, stretchable and rigid-stretchable sections of the flexible circuit. Particularly, any number of rip stop transition layers are able to be deposited on the inner layers and/or outer layers of the circuit depending upon the desired application. The method ends in the step 340.

In operation, one or more rip stop transition layers are formed and deposited onto a deformable electronic such as a flexible circuit in order to strengthen the circuit. The rip stop material is attached at a stress area of a flexible circuit board in order to strengthen the flexible circuit board and minimize ripping and cracking of the circuit and the polyimide and/or the copper conductors of the circuit. A rip stop transition layer is formed and deposited at a location on the flexible circuit in order to minimize, reduce, if not preventing cracking and ripping of the circuit as it is bent and flexed. The rip stop transition layer can be placed at different locations on and within the flexible circuit in order to minimize cracking and ripping and the flexible circuit is bent, flexed and twisted.

Specifically, a rip stop layer is bonded inside, outside or to the casing of the flexible circuit. Particularly, rip stop layer is able to bend and move with the flexible circuit in order to minimize, reduce, if not preventing cracking and ripping. Additionally, one or more rip stop layers can be placed in high stress areas of the circuit such as where it is commonly twisted, bent, and flexed. Accordingly, the flexible circuit is strengthened in its high stress areas. In this manner depositing one or more rip stop material layers onto the flexible circuit decreases the chance that the circuit will rip or tear and mechanically fail. Accordingly, applying a rip stop material to a flexible circuit board in order to strengthen the circuit and minimize, reduce, if not preventing rips and cracks as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to strengthen any deformable electronic.

What is claimed is:

1. A deformable electronic device comprising:
   a. a deformable electronic device body comprising a center pre-preg section and a flexible base with coverlays coupled to the flexible base; and
   b. a plurality of rip stop material layers deposited at boundary portions of the pre-preg section and the coverlays but not along entire surfaces of the coverlays, and at inside locations and along a length of the body, wherein at least two of the plurality rip stop material layers are positioned along the same plane within the body.

2. The deformable electronic device of claim 1, wherein at least one of the rip stop material layers is deposited at a high stress location of the deformable electronic device.

3. The deformable electronic device of claim 1, wherein at least one of the rip stop material layers comprises an open weave interlocking fabric.

4. The deformable electronic device of claim 1, wherein at least one of the rip stop material layers is attached to one of a rigid, a rigid-flex, a stretch, a rigid-stretch, and a mechanism housing of the deformable electronic device.

5. The deformable electronic device of claim 1, wherein the deformable electronic device comprises a flexible circuit board.

6. The deformable electronic device of claim 1, wherein at least one of the rip stop material layers is attached to the outsides of the deformable electronic device.

7. The deformable electronic device of claim 1, wherein at least two of the rip stop material layers are laminated along the same plane and on top of one of the coverlays.

8. The deformable electronic device of claim 1, wherein at least one of the rip stop material layers is laminated on top of the flexible base before the coverlays are laminated.

9. The deformable electronic device of claim 1, wherein at least one of the rip stop material layers is deposited at a high twist area of the deformable electronic device.

10. The deformable electronic device of claim 1, wherein each of the coverlays includes a pre-preg area, wherein all pre-preg areas are vertically aligned within the body to form the pre-preg section, wherein the pre-preg section is coupled with a cap at each end of the pre-preg section.

11. The deformable electronic device of claim 10, wherein at least one of plurality of rip stop material layers is in contact with at least a portion of a surface of the pre-preg area of the each of the coverlays, wherein the pre-preg area of the each of the coverlays is centrally located in the each of the coverlays.

12. A method of strengthening a deformable electronic device including a flexible base, coverlays, and a center pre-preg section, that together form a body, the method comprising:
    a. forming a plurality of rip stop material layers; and
    b. depositing the plurality of rip stop material layers at inside locations and along a length of the body of the deformable electronic device, and also at boundary potions of the pre-preg section and the coverlays but not along the entire surfaces of the coverlays, wherein at least two of the plurality rip stop material layers are disjointedly positioned along the same horizontal plane within the body.

13. The method of claim 12, wherein at least one of the rip stop material layers is deposited at a high stress location of the deformable electronic device.

14. The method of claim 12, wherein at least one of the rip stop material layers comprises an open weave interlocking fabric.

15. The method of claim 12, wherein at least one of the rip stop material layers is attached to one of a rigid, a rigid-flex, a stretch, a rigid-stretch, and a mechanism housing of the deformable electronic device.

16. The method of claim 12, wherein the deformable electronic device comprises a flexible circuit board.

17. The method of claim 12, wherein at least one of the rip stop material layers is attached to the outsides of the deformable electronic device.

18. The method of claim 12, wherein at least two of the rip stop material layers are laminated along the same plane and on top of one of the coverlays.

19. The method of claim 12, wherein at least one of the rip stop material layer is laminated on top of the flexible base before the coverlays are laminated.

20. The method of claim 12, wherein at least one of the rip stop material layer is deposited at a high twist area of the deformable electronic device.

* * * * *